United States Patent
Topp et al.

(10) Patent No.: US 6,538,289 B1
(45) Date of Patent: Mar. 25, 2003

(54) SMART POWER COMPONENT

(75) Inventors: Rainer Topp, Reutlingen (DE); Wolfgang Troelenberg, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/701,400

(22) PCT Filed: Apr. 1, 1999

(86) PCT No.: PCT/DE99/00986
§ 371 (c)(1),
(2), (4) Date: Feb. 26, 2001

(87) PCT Pub. No.: WO99/62174
PCT Pub. Date: Dec. 2, 1999

(30) Foreign Application Priority Data

May 28, 1998 (DE) .......................................... 198 23 768

(51) Int. Cl.⁷ .............................................. H01L 23/62
(52) U.S. Cl. ..................... 257/360; 257/361; 257/362
(58) Field of Search ................................ 257/355, 356, 257/360, 361, 362

(56) References Cited

U.S. PATENT DOCUMENTS

| 4,990,978 A | * | 2/1991 | Kondoh ...................... 257/335 |
| 5,142,171 A | | 8/1992 | Nunogawa et al. |
| 5,432,371 A | * | 7/1995 | Denner et al. .............. 257/355 |

FOREIGN PATENT DOCUMENTS

| EP | 0 808 025 | 11/1997 |
| WO | WO 96 12346 | 4/1996 |

* cited by examiner

*Primary Examiner*—Minh Loan Trap
(74) *Attorney, Agent, or Firm*—Kenyon & Kenyon

(57) ABSTRACT

A power component is proposed which reliably switches inductive loads and has a current detection element to detect the current through the inductive load. The component includes a protective element which is connected to the source terminals of the sense element and of the actuator. The protective element protects against parasitic effects between the sense element and the actuator.

13 Claims, 3 Drawing Sheets

SMART POWER COMPONENT

FIELD OF THE INVENTION

The present invention relates to a power component.

BACKGROUND INFORMATION

Power components having an actuator which is adjacent to a measuring element are already known in the form of SENSEFET transistors.

SUMMARY OF THE INVENTION

In contrast, the power component of the present invention has the advantage that it ensures safe and reliable operation even with high currents through the actuator as well as protection against the risk of failure.

In SmartPower components such as SENSEFET transistors in particular (in DMOS design, for example) or in IGBT transistors having an integrated sense element, a reliable protection is ensured against overvoltange and breakdowns between the sense cell and adjacent DMOS cell. In particular when employed as a high-side switch, critical operating conditions such as, for example ground and/or battery separation, ISO pulses (interference pulses from the supply system) or with inductive loads or cable inductances can be withstood without risk of failure of the power component. Moreover, it has proven to be advantageous that there is no adverse effect on the current detection by the sense element in normal operation as a consequence of the arrangement provided. Moreover, the arrangement can be integrated monolithically.

If the arrangement prevents an activation of existing parasitic bipolar transistors, for example, by preventing the buildup of the base potential, then the danger of a second breakdown with subsequent fusing is prevented.

DETAILED DESCRIPTION

Figure 1:
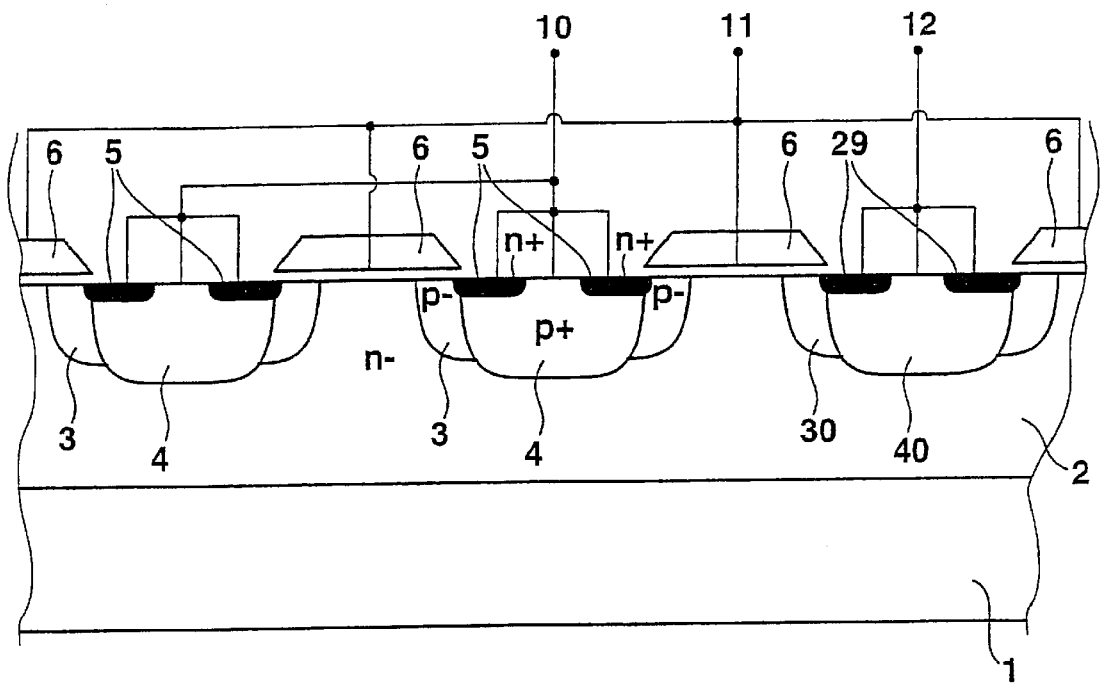
FIG. 1 shows a SENSEFET transistor in cross-section.

FIG. 1 shows a transistor having a sense element, in cross-section. A weakly n-doped semiconductor layer is arranged on a p-doped substrate 1. Weakly p-doped regions 3 are arranged in semiconductor layer 2, the p-doped regions being separated from each other by regions of semiconductor layer 2. A strongly p-doped region 4 is arranged in the center of each of regions 3, the p-doped region extending from the surface of the semiconductor component to a depth in which region 4 is always directly in contact with semiconductor layer 2. Strongly n-doped regions 5 are incorporated in the margins of strongly p-doped regions 4, each of strongly n-doped regions 5 extending somewhat into weakly p-doped region 3 at the edge of each of the strongly p-doped regions 4. A weakly p-doped region 30 is 25 also incorporated in semiconductor layer 2 by analogy to region 5. By analogy to region 4, a strongly p-doped region 40 is incorporated in weakly p-doped region 30; by analogy to strongly n-doped regions 5, strongly n-doped region 29 is incorporated in strongly p-doped region 40. Gate electrodes 6, insulated from the semiconductor layer by an insulating layer, are arranged above the regions of semiconductor layer 2 which extend to the surface of the semiconductor component. Gate electrodes 6 are electrically connected with each other and can be electrically contacted via gate terminal 11. Strongly n-doped regions 5 and strongly p-doped regions 4 are electrically connected with each other and can be jointly electrically contacted via source/load terminal 10. Regions 40 and 29 are also electrically connected and can be electrically contacted via sense terminal 12. Oxide layers and necessary metallic coatings on the surface of the semiconductor component are not shown in FIG. 1 for reasons of simplicity of presentation. If the component of FIG. 1 is designed as a DMOS power transistor, a strongly n-doped drain region, for example, is incorporated in weakly n-doped semiconductor layer 2. This drain region is not shown in FIG. 1. This drain region can be electrically contacted via a front drain terminal which is also not illustrated and in addition to load terminal 10, gate terminal 11 and sense terminal 12, represents the fourth terminal of a SENSEFET transistor.

The p-region 3, p-region 30 and the region of semiconductor layer 2 lying between the two p-regions form a parasitic PMOS transistor. At a gate potential which is lower than the potential at sense terminal 12, this parasitic PMOS transistor has a threshold voltage between source terminal 10 and sense terminal 12 which is, for example, 4 volts. If region 30 which represents the source region of the PMOS transistor is then in contact with a potential which is at least 4 volts higher than the potential of the p-region, a parasitic p channel is activated in semiconductor layer 2. The parasitic PMOS transistor shifts current into region 3 of the adjacent DMOS cell which functions simultaneously as the base of a vertical npn bipolar transistor. This parasitic npn transistor is formed by regions 5, 3/4 and semiconductor layer 2. In normal operating conditions, switching through this parasitic npn bipolar transistor by a short-circuit between the strongly n-doped region 5 and strongly p-doped region 4 is effectively prevented. The current of the parasitic PMOS transistor, however, allows the potential to build up in the base region of the parasitic bipolar transistor so that the npn bipolar transistor is activated and there exists the danger of a second breakdown with fusion.

Figure 2:
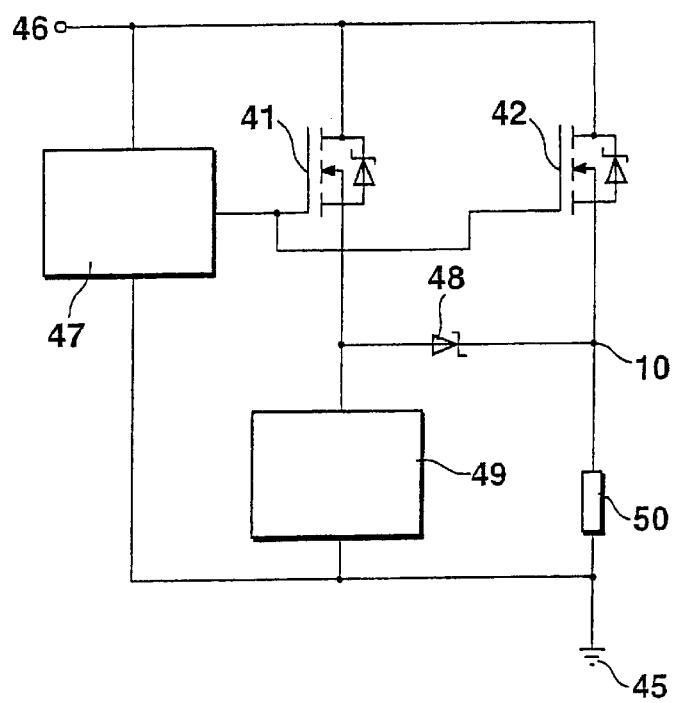
FIG. 2 shows a first exemplary embodiment.

FIG. 2 shows a SENSEFET transistor 41, 42, a sense element 41 and an actuator 42 which, for example, is also constructed using DMOS technology. The gate electrodes of sense element 41 and actuator 42 are connected with a control circuit 47 which in turn is connected to the power supply via both ground terminal 45 and voltage source 46.

Voltage source 46 is also connected to the drain terminals of the sense element and actuator. An analysis circuit 49 is connected between ground 45 and the source terminal of sense element 41. An inductive load 50 is connected between source terminal 10 of actuator 42 and ground 45. A protective diode 48 is connected between source terminal 10 of actuator 42 and the source terminal of sense element 41, the negative pole of the protective diode being connected to source terminal 10 of actuator 42.

(Externally controllable) control circuit 47 controls the current through actuator 42. Analysis circuit 49 evaluates the current through sense element 41 which functions as a current detection element. Depending on the application, analysis circuit 49 is connected to other electronic circuits or to control circuit 47 in order to make the information concerning the size of the load current through actuator 42 available to the other circuit components and to control circuit 47. If a ground separation or a voltage source separation occurs at inductive load 50, the potential of source terminal 10 becomes negative due to the magnetic induction. As a result, protective diode 48 becomes conductive which guarantees that the source terminal of sense element 41 has a potential which is only a forward voltage higher than the potential of source terminal 10. This effectively prevents the parasitic PMOS transistor from being activated. In normal operation, however, the diode does not influence the function of sense element 41 since in normal operation, protective element 48 is switched in reverse direction.

Figure 3:
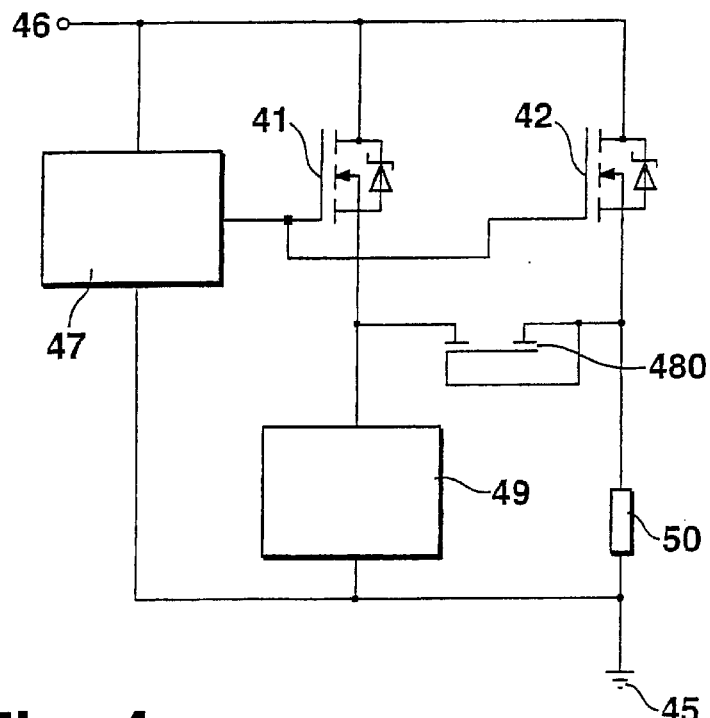
FIG. 3 shows a second exemplary embodiment.

FIG. 3 shows an additional exemplary embodiment in which the same components are identified with the same reference symbols as in FIG. 2 and are not described again.

Instead of protective diode 48 in FIG. 2, a PMOS transistor 480 is connected to the source terminals of sense element 41 and actuator 42, the transistor being connected as a diode in such a way that with negative potential of source terminal 10 of actuator 42, the PMOS transistor is switched through.

Figure 4:
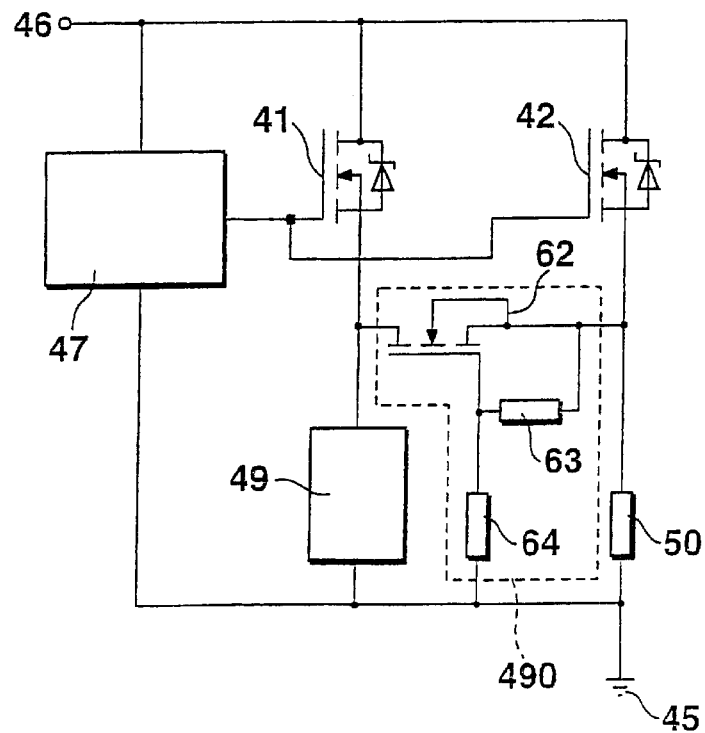
FIG. 4 shows a third exemplary embodiment.

FIG. 4 shows an additional exemplary embodiment in which a suppressor circuit 490 is arranged instead of protective element 48. This suppressor circuit 490 has an NMOS transistor 62, a first resistor 63 and a second resistor 64. First resistor 63 is connected to the source terminal of actuator 42. First resistor 63 is also connected with second resistor 64. Second resistor 64 is connected to ground 45. The first and second resistors are connected to the gate electrode of NMOS transistor 62. The source terminal of transistor 62 is connected to source terminal 20 of actuator 42. The drain terminal of transistor 62 is connected to the source terminal of sense element 41.

NMOS transistor 62 switches through if actuator 42 has a negative source potential. The amount of the negative potential at which NMOS transistor 62 switches through can be adjusted via the resistance values of first resistor 63 and second resistor 64.

Figure 5A:
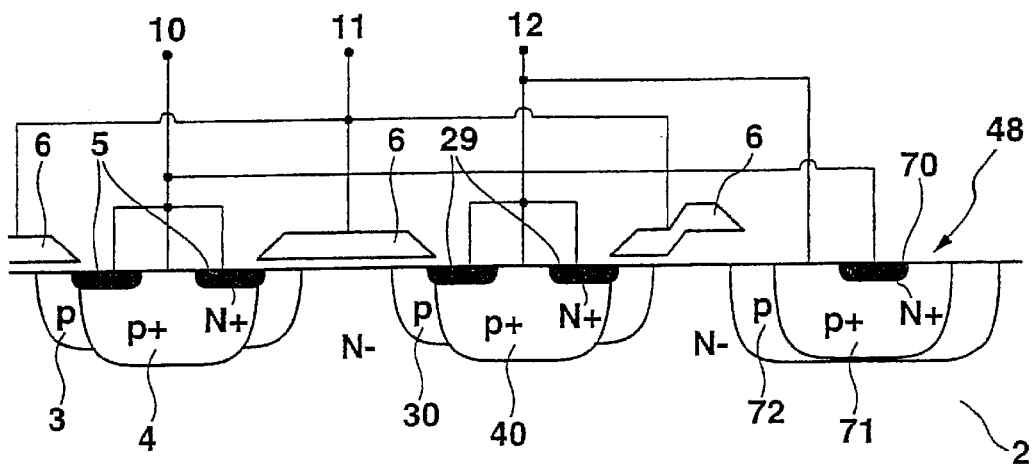
FIG. 5a shows a fourth exemplary embodiment.
Figure 5B:
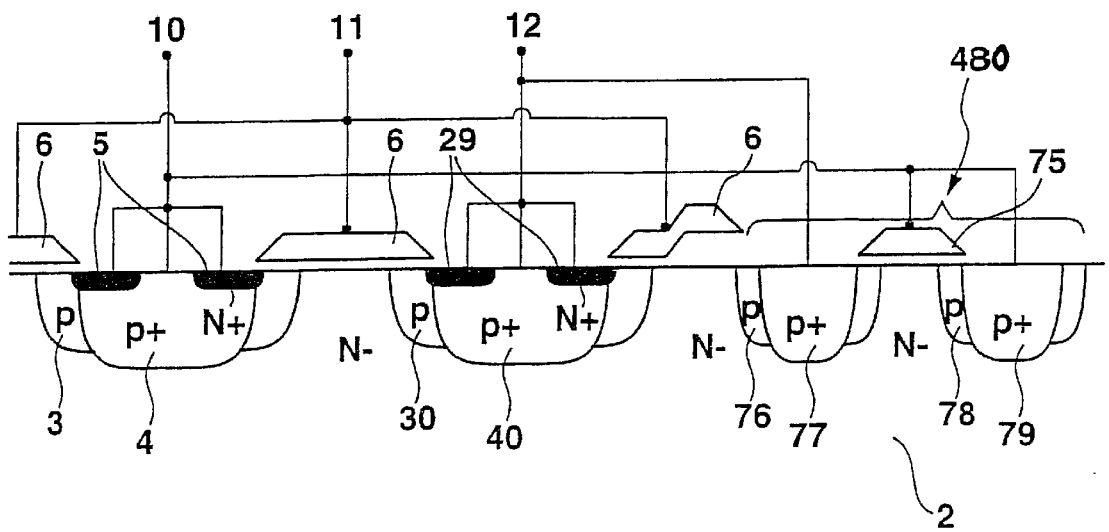
FIG. 5b shows a fifth exemplary embodiment.

FIG. 5a shows a cross-section of a component according to FIG. 1 with an integrated protective diode 48. The same reference symbols as in FIG. 1 are not described here once more. Protective diode 48 has a weakly p-doped region 72 incorporated in semiconductor layer 2, a strongly p-doped region 71 being incorporated in turn in p-doped region 72 which surrounds p-doped region 71. A strongly n-doped region 70 is in turn incorporated in strongly 10 p-doped region 71. Strongly n-doped region 70 is electrically connected to source terminal 10; strongly p-doped region 71 is connected to sense terminal 12. Similar to FIG. 1, electrical insulating layers and metal coatings have been left out of the drawing for simplification of presentation. This also explains, for example, the stage of the right-hand one of the three gate electrodes 6 shown which is underlaid with an insulating layer. FIG. 5b shows a power component according to FIG. 1 with a protective element 480 designed as a PMOS transistor. Protective element 480, which is arranged in the vicinity of the sense element, has two weakly p-doped regions 76 and 79 incorporated in semiconductor layer 2, strongly p-doped regions 77 and 79 being incorporated in turn in weakly p-doped regions 76 and 78, the strongly p-doped regions completely penetrating p-doped regions 76 and 78 and being in direct contact with semiconductor layer 2. Gate electrode 75 of protective element 480 is connected to source terminal 10; strongly p-doped region 77 is connected to sense terminal 12 and strongly p-doped region 79 is, like gate electrode 75, connected to source terminal 10.

FIGS. 5a and b show simple implementations of the circuits according to FIGS. 2 and 3, respectively. No additional expense is necessary to implement protective elements 48 and 480 since regions 71, 72, 76, 77, 78 and 79 can be produced together with the semiconductor regions necessary for the actuator and the sense element. Of course, protective elements 48 and 480 can also be used in back-contacted components, i.e., vertical power components or even IGBT components.

What is claimed is:

1. A power component, comprising:
    an actuator;
    a measuring element to perform current detection, and being adjacent to the actuator;
    a first source terminal for the actuator;
    a second source terminal for the measuring element;
    a power supply;
    a ground terminal;
    a voltage source connected to the first source terminal and the second source terminal;
    an inductive load arranged between the first source terminal and the ground terminal;
    a control circuit to connect the measuring element and the actuator and to control a current running through the actuator, and being connected to the power supply via the ground terminal and the voltage source;
    an analysis circuit to evaluate a current running through the measuring element and to make information concerning a size of the current running through actuator available to the control circuit, and being connected to the control circuit and arranged between the ground terminal and the second source terminal; and
    an arrangement for protecting against a parasitic current and being connected between the first source terminal and the second source terminal, the arrangement for protecting being conductive when a negative potential is present at the first source terminal.

2. The component according to claim 1, further comprising:
    a semiconductor layer of a first conductivity type;
    a first region of a second conductivity type embedded in the semiconductor layer;
    a second region of the second conductivity type embedded in the semiconductor layer and being arranged adjacent to and separate from the first region; and
    a structure including at least one of:
        at least one third region embedded in the first region, and
        at least one fourth region embedded in the second region, wherein:
            the first region is connected to the first source terminal,
            the second region is connected to the second source terminal,
            the first region, the second region, and a region of the semiconductor layer between the first region and the second region form a parasitic MOS transistor, and
    the arrangement for protecting prevents a voltage present between the first source terminal and the second source terminal from attaining a threshold value that would result in an activation of the parasitic MOS transistor.

3. The component according to claim 2, wherein:
    the first region, the at least one third region, and a region of the semiconductor layer lying between the first region and the at least one third region form a parasitic bipolar transistor, the first region is short-circuited with the at least one third region and forms a base of the parasitic bipolar transistor, and the arrangement for protecting prevents an activation of the parasitic bipolar transistor.

4. The component according to claim 2, wherein:

the arrangement for protecting is blocked as long as the threshold value is not reached.

5. The component according to claim 1, wherein:

the arrangement for protecting includes a Zener diode, an anode of the Zener diode is connected to the second source terminal, and a cathode of the Zener diode is connected to the first source terminal.

6. The component according to claim 1, wherein:

the arrangement for protecting includes an MOS transistor that is connected as a diode to the first source terminal and the second source terminal, such that when the negative potential is present at the first source terminal the MOS transistor is switched through.

7. The component according to claim 1, wherein:

the arrangement for protecting includes a protective circuit having at least one resistor with a resistance enabling an adjustment of an amount of the negative potential at the first source terminal to activate a suppressor circuit.

8. The component according to claim 1, wherein:

the component is designed as an MOS component.

9. The component according to claim 1, wherein:

the component is designed as an IGBT component.

10. The component according to claim 1, wherein:

the arrangement for protecting is monolithically integrated with the actuator and the measuring element.

11. The component according to claim 1, wherein:

the component is capable of switching an inductive load without risk of failure.

12. The component according to claim 11, wherein:

the component switches the inductive load as a high-side switch.

13. The component according to claim 1, wherein:

the arrangement for protecting ensures an undisturbed operation of the measuring element as long as the arrangement for protecting is not activated.

* * * * *

UNITED STATES PATENT AND TRADEMARK OFFICE
CERTIFICATE OF CORRECTION

PATENT NO. : 6,538,289 B1  Page 1 of 1
DATED : March 25, 2003
INVENTOR(S) : Rainer Topp et al.

It is certified that error appears in the above-identified patent and that said Letters Patent is hereby corrected as shown below:

Column 1,
Line 63, change "30 is 25 also" to -- 30 is also --

Column 3,
Line 47, change "strongly 10 p-doped" to -- strongly p-doped --
Line 59, change "76 and 79" to -- 76 and 78 --

Signed and Sealed this

Twenty-fifth Day of May, 2004

JON W. DUDAS
*Acting Director of the United States Patent and Trademark Office*